United States Patent [19]

Reynolds, Jr. et al.

[11] Patent Number: 4,470,368
[45] Date of Patent: Sep. 11, 1984

[54] LPE APPARATUS WITH IMPROVED THERMAL GEOMETRY

[75] Inventors: Claude L. Reynolds, Jr., Wyomissing; Maria C. Tamargo, Reading, both of Pa.

[73] Assignee: AT&T Bell Laboratories, Murray Hill, N.J.

[21] Appl. No.: 356,931

[22] Filed: Mar. 10, 1982

[51] Int. Cl.³ .......................................... H01L 21/208
[52] U.S. Cl. ..................................... 118/412; 118/415
[58] Field of Search ........................ 118/412, 415, 422; 156/622; 148/171, 172

[56] References Cited

U.S. PATENT DOCUMENTS

| | | | |
|---|---|---|---|
| 3,690,965 | 9/1972 | Bergh et al. | 148/172 |
| 3,741,825 | 6/1973 | Lockwood et al. | 148/171 |
| 3,770,518 | 11/1973 | Rosztoczy et al. | 118/415 X |
| 3,950,195 | 4/1976 | Rode et al. | 148/171 |
| 4,201,623 | 5/1980 | Sumner | 148/171 X |
| 4,359,012 | 11/1982 | Nishizawa | 118/415 X |

OTHER PUBLICATIONS

Journal of Crystal Growth, 1981, "Use of Sapphire Liners to Eliminate Edge Growth in LPE (Al, Ga)As," Tamargo et al., pp. 325-329.
Applied Physics Letters, Aug. 1, 1981, "Low Threshold Current Density in GaAsP/InP Lasers Grown in a Vertical Liquid Phase Epitaxial System," Tamari et al., pp. 185-187.

Primary Examiner—John P. McIntosh
Attorney, Agent, or Firm—Michael J. Urbano

[57] ABSTRACT

In LPE boat-slider apparatus the boat, which carries the melts, is made of lower thermal conductivity material than the slider, which carries the substrate. Illustratively, the boat comprises sapphire and the slider comprises graphite. A confined-melt geometry is also described in which another slider, used to skim off thin portions of the melt, is also made of the lower thermal conductivity material.

6 Claims, 4 Drawing Figures

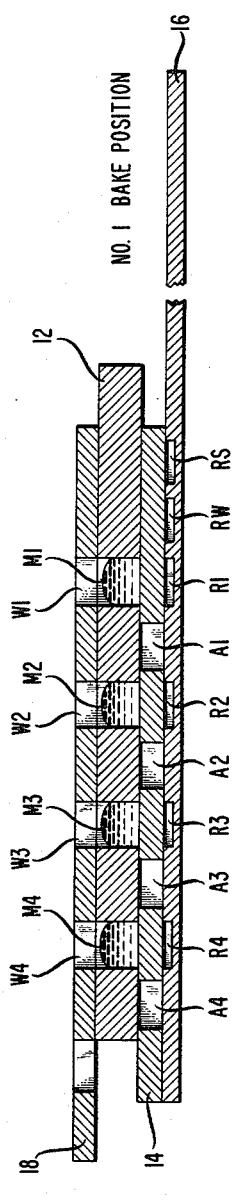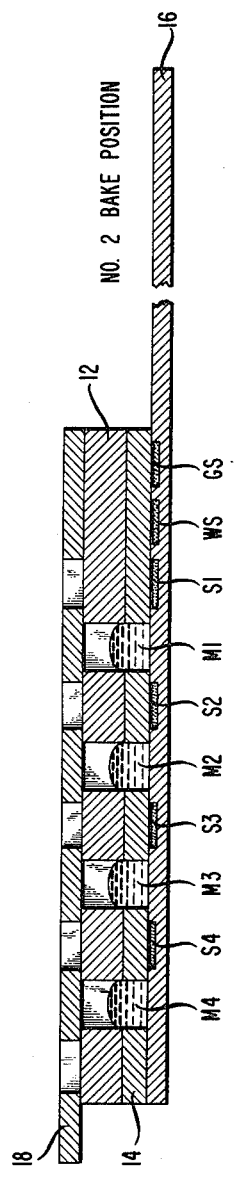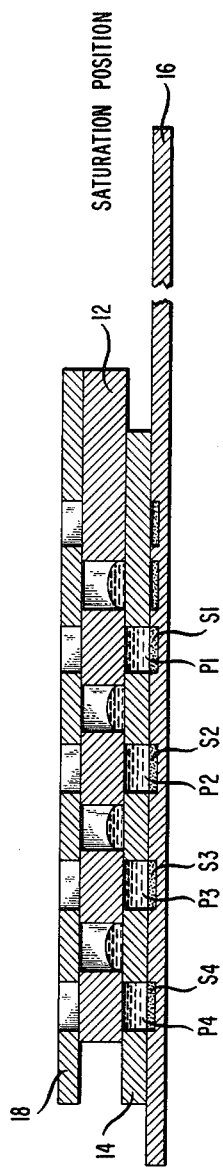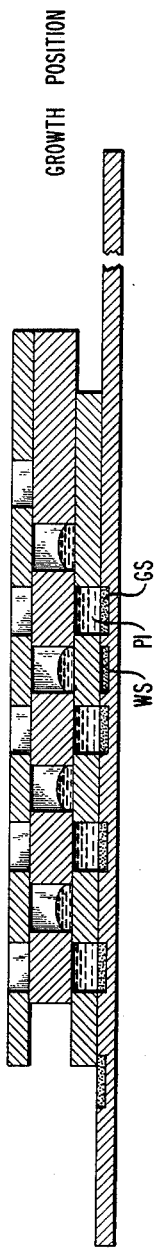

LPE APPARATUS WITH IMPROVED THERMAL GEOMETRY

BACKGROUND OF THE INVENTION

This invention relates to epitaxial growth processes and, more particularly, to liquid phase epitaxy (LPE) using boat-slider apparatus.

In the prior art, horizontal growth of Group III-V compounds is commonly accomplished using a boat-slider apparatus and ramp-cooling techniques. U.S. Pat. No. 3,741,825 granted to H. F. Lockwood et al on June 16, 1973 is illustrative of both the apparatus and technique. Briefly, the apparatus comprises a graphite solution holder or boat having a plurality of tandem wells for carrying source solutions (melts). A graphite slider having at least two recesses in tandem, one for carrying a substrate and another for carrying a saturation seed, is inserted in a channel which extends horizontally through the boat and beneath the wells. The saturation seed precedes the substrate under each solution. Thus, in operation the boat is loaded with appropriate source solutions (e.g., Ga solutions of GaAs), and the slider is loaded with the substrate and saturation seed. The apparatus is then placed in a quartz tube within a furnace. After flushing of the ambient with a suitable gas such as hydrogen, the furnace temperature is raised to a temperature at which the source solutions are saturated (about 800° C for GaAs). A controlled cooling program is then instituted and the slider is moved until the saturation seed is located under the first well to establish local liquidus equilibrium. Then the slider is again moved until the saturation seed is under the second well and the substrate is under the first well. Epitaxial growth takes place on the substrate at a rate determined by the cooling rate. Simultaneously the saturation seed establishes local liquidus equilibrium at the bottom of the second solution. Repetition of these steps results in the growth of multilayered structures, for example, GaAs-AlGaAs double heterostructure junction lasers.

During epitaxial growth by this equilibrium cooling technique, when the furnace temperature is lowered, heat flows outward from the melt, giving rise to both horizontal and vertical temperature gradients. These gradients produce a nonuniform temperature profile near the melt-substrate interface, with consequent nonuniform epitaxial growth. These nonuniformities exhibit themselves in at least two ways: variations in layer thickness across the usable, central portion of a wafer and excessive edge growth along the periphery of a wafer. Layer thickness variations result in obvious problems of device reproducibility. Edge growth reduces usable wafer area and, depending on boat-slider spacing, may scratch particles of graphite onto the wafer, disrupting epitaxial growth of subsequent layers.

SUMMARY OF THE INVENTION

We have found that an essentially one-dimensional heat flow downward through the melt toward the substrate, and a more nearly uniform temperature profile over the growth interface in a plane parallel to the substrate, can be realized, in accordance with our invention, by fabricating the LPE boat-slider apparatus such that the boat which carries the melts comprises a material having a lower thermal conductivity $\kappa$ than the slider which carries the substrate. Illustratively, the boat comprises sapphire and the slider comprises graphite.

This apparatus has several attendant advantages: improvement of layer uniformity, elimination of edge growth (tapered edges actually result), and improved wetting of Ga melts by the use of sapphire. The latter feature has the further advantage of reducing meniscus lines and rake lines in the epitaxial layers by modifying the slip-stick motion characteristic of Ga on the substrate.

BRIEF DESCRIPTION OF THE DRAWING

Our invention, together with its various features and advantages, can be readily understood from the following more detailed description taken in conjunction with the accompanying drawing, in which FIGS. 1-4 are cross-sectional views of LPE boat-slider apparatus depicting four illustrative positions of the boat and sliders during various steps in a typical processing sequence.

DETAILED DESCRIPTION

With reference now to FIG. 1, LPE boat-slider apparatus 10 comprises a solution holder 12 having a plurality of wells W1-W4 for carrying source solutions or melts M1-M4, respectively. Four are shown for the purpose of illustrating the growth of a four-layer double heterostructure (DH) laser, but the precise member used depends on the design of the device being fabricated. A slidable cover 18, with apertures registrable with the wells, is located on top of holder 12. Disposed beneath the holder 12 is an optional, but preferred, upper slider 14 having four apertures A1-A4 extending transversely therethrough. Disposed, in turn, beneath slider 14 is a lower slider 16 having six recesses RS, RW, and R1-R4 for carrying a like number of semiconductor substrates. As shown in FIG. 2, a growth substrate or wafer GS, a wiper substrate WS, and four saturation substrates or seeds S1-S4 are inserted in recesses RS, RW, and R1-R4, respectively.

When upper slider 14 is omitted, lower slider 16 slides on the bottom of holder 12 and the apparatus is said to have a free-standing melt geometry. On the other hand, when both sliders 14 and 16 are included, the apparatus can be used in a confined-melt geometry.

The LPE technique utilizing the confined-melt geometry boat-slider apparatus is briefly as follows. After loading the wells W1-W4 with suitable melts M1-M4 for growing the desired layers, the apparatus is placed in a quartz tube in a furnace (not shown) and baked-out. As shown in FIG. 1, during these steps the apertures of cover 18 are in registration with wells W1-W4, but holder 12 is displaced to the right so that apertures A1-A4 of slider 14 are not in registration with wells W1-W4 but rather are located between the wells. For convenience of explanation, lower slider 15 is shown positioned so that saturation substrates S1-S4 are in registration with wells W1-W4, although such registration is not critical. Next, as shown in FIG. 2, holder 12 is translated to the left so that wells W1-W4 and apertures A1-A4 are in registration and melts M1-M4 fill the apertures. In this position a second bake-out may be performed, dopants may be added to the melts and an additional bake-out done. In the latter case, cover 18 blocks the top of wells W1-W4 to prevent the escape of the gaseous form of the dopants which may be highly volatile. Next, as shown in FIG. 3, sliders 14 and 16 are simultaneously translated to the left causing melt portions P1-P4 to be skimmed off the bottom of melts M1-M4; and bottom slider 16 is further translated to the left to bring saturation seeds S1-S4 into registration and contact with melt portions P1-P4. This position is maintained for a well-known time and temperature suitable to saturate the melt portions P1-P4. After saturation is complete, a controlled cooling program is instituted and slider 16 is again translated to the left so that wiper substrate WS wipes the bottom of melt portion P1. Then the lower slider 16 is further translated left, as seen in FIG. 4, to position the growth substrate GS under melt portion P1 and to cause the first layer to grow epitaxially thereon. The second and subsequent layers are similarly grown by translating the lower slider 16 to left to position the growth substrate GS sequentially under melt portions P2, P3 and P4.

In accordance with our invention, the solution holder 12 is made of a material having a lower thermal conductivity $\kappa$ than the material from which the lower slider 16 is made. This thermal geometry advantageously results in essentially one-dimensional heat flow downward toward the growth substrate and a highly uniform temperature profile over the growth interface in a plane parallel to the substrate. Illustratively, holder 12 comprises sapphire having $\kappa = 0.09$ W/cmK and lower slider 16 comprises graphite having $\kappa = 0.48$ W/cmK at a typical growth temperature of 780° C. Additionally, where the optional upper slider 14 is employed, it too should be made of the lower thermal conductivity material. The use of slider 14 and the confined-melt geometry is particularly advantageous in realizing the desired thermal profiles because in the growth position depicted in FIG. 4, for example, the thin melt portion P1 is surrounded on the top and sides by sapphire but on the bottom by graphite. Similar comments apply to melt portions P2-P4 when each is in contact with growth substrate GS.

An alternative to sapphire is boron nitride which has $\kappa = 0.34$ W/cmK, considerably higher than that sapphire but still sufficiently below that of graphite to realize the desired thermal profile. However, for reasons discussed below, sapphire is preferred.

EXAMPLE

The following example describes the fabrication of GaAs-AlGaAs DH lasers using a confined-melt geometry LPE boat-slider apparatus as shown in FIGS. 1-4. Unless otherwise stated, specific dimensions, materials, and other parameters are provided by way of illustration only and are not intended to limit the scope of the invention.

The apparatus we utilized had a sapphire solution holder 12 about 0.3 inches thick, a sapphire upper slider 14 about 0.1 inches thick, and a graphite lower slider 16 about 0.1 inches thick. Each of these piece parts was about 0.915 inches wide. The wells W1-W4 and apertures A1-A4 all measured about 0.5×0.7 inches whereas the substrate recesses were slightly larger, measuring about 0.5×0.75 inches. The wells were separated from one another by about 0.7 inches thick sapphire walls.

The melts in the wells comprised the following materials: M1—Ga, Al, GaAs, Te; M2—Ga, Al, GaAs; M3—Ga, Al, GaAs, Ge; and M4—Ga, GaAs, Ge. The substrates were all (001)-oriented n-GaAs. These melts, in conjunction with the controlled cooling program (780° C. growth temperature, 0.2° C./min cooling rate, He + 11% H$_2$ ambient), were effective to grow double heterostructures including a 2.0 $\mu$m thick n-Al$_{0.36}$Ga$_{0.64}$As first cladding layer on the growth substrate, an unintentionally doped 0.10 $\mu$m thick Al$_{0.07}$Ga$_{0.93}$As active layer on the first cladding layer, a 1.5 $\mu$m thick p-Al$_{0.36}$Ga$_{0.64}$As second cladding layer on the active layer, and a 0.6 $\mu$m thick p-GaAs cap (contact facilitating) layer on the second cladding layer.

Layer thicknesses were determined on cleaved wafers with a scanning electron microscope. Top-to-bottom as well as side-to-side tapers could be detected from the position of the measurements. The incidence of undulations in the thickness of the active layer, or rake lines, was monitored by transmission cathodoluminescence. The slices were processed into 5 $\mu$m shallow proton bombarded stripe geometry lasers (380 $\mu$m long) for continuous wave (CW) electro-optical testing.

The use of our sapphire-graphite apparatus resulted in several improvements in the LPE growth of the DH laser material as compared to similar material grown under essentially identical conditions except that a graphite apparatus was used. The flat temperature profile over the melt-substrate interface yielded more uniform layer thicknesses. We prepared probability plots of the variation of the total thickness of the p-type layers of wafers fabricated as described above. Although the variation in only the sum of the p-layers was plotted, a similar improvement was observed for the other layers in the double heterostructure. It is the sum of the p-layers which is important for the proper implant depth in shallow proton-delineated stripe geometry lasers, and a variation of $\leq 20\%$ is desired. Approximately 80% of the material grown in our sapphire-graphite apparatus had a thickness variation less than 20% as compared to only 40% for wafers grown in the graphite apparatus. It should be mentioned that both of these are substantially better than a graphite boat-slider apparatus with a freestanding melt. A more subtle effect with the confined-melt geometry is that the same degree of control can be achieved for both the n-type first cladding layer and the sum of the p-type layers. Thus, it is not necessary to sacrifice thickness variations in one layer for those in another. Further confirmation for the layer thickness uniformity of material grown in our sapphire-graphite apparatus was provided by mapping of the layer thickness over the wafer. We found that both the n-type and p-type layers were uniform over the entire wafer, representing a substantial improvement in layer thickness uniformity for LPE grown AlGaAs.

As mentioned earlier, our apparatus produces a more uniform temperature profile within the melt which gives rise to a slight taper near the edge of the wafer instead of the excess edge growth normally observed for material grown in a graphite apparatus by the equilibrium cooling technique. The lack of excess edge growth with our apparatus enables one to reduce the clearance between the substrate and wiping surface, thus reducing melt carryover. Reduced melt carryover has been correlated with decreased temperature dependence of laser threshold current.

Using ~10 $\mu$m clearance, we made emission wavelength measurements on lasers grown in our apparatus with lattice matched GaAsSb active layers of the type described by P. J. Anthony in application Ser. No. 219,509 filed on Dec. 30, 1980, now U.S. Pat. No. 4,386,429 issued on May 31, 1983 and assigned to the assignee hereof. These measurements gave wavelength values of 8812±33 Angstroms and are comparable to those obtained by others with the use of additional "wash" melts, thus indicting a minimal amount of carry-over. We also made a comparison of the intra-wafer variation in emission wavelength for DH laser material with $Al_{0.07}Ga_{0.93}As$ active layers. The standard deviation of emission wavelengths of material grown in our sapphire-graphite apparatus ranged from 12 to 26 whereas that grown in a graphite ranged from 11 to 63. Low temperature photoluminescence measurements also showed good uniformity within each wafer.

In addition to the favorable thermal properties, the presence of sapphire in our apparatus also results in useful wetting properties. Observations of the graphite and sapphire pieces after epitaxial growth indicated that gallium wets sapphire more easily than graphite. Subsequent contact angle measurements of gallium on graphite and sapphire confirmed this to be true. Since gallium wets sapphire, the slip-stick motion of the melt over the growth substrate is modified as the substrate slides from one melt to the next. This particular property resulted in less prominent meniscus lines on the surface of the epitaxial layers and, more importantly, in DH laser material which is free of rake lines, or undulations in the thickness of the active layer. In contrast, previous data have indicated that the incidence of rake lines is approximately 20% for material grown in a graphite apparatus of the confined-melt geometry.

It is to be understood that the above-described arrangements are merely illustrative of the many possible specific embodiments which can be devised to represent application of the principles of the invention. Numerous and varied other arrangements can be devised in accordance with these principles by those skilled in the art without departing from the spirit and scope of the invention. In particular, although our apparatus has been described with respect to the fabrication of AlGaAs and GaAsSb DH lasers, it is also useful with other materials (e.g., other Group III-V materials such as InP-InGaAsP) and for making other devices (e.g., LEDs, photodiodes and FETs).

What is claimed is:

1. Apparatus for the liquid phase epitaxial growth of semiconductor layers on a semiconductor substrate comprising
    a solution holder having a plurality of wells for carrying source solutions from which said layers are to be grown,
    a lower slider disposed under said holder and having a recess therein for carrying said substrate, characterized in that
    said holder comprises a material having a lower thermal conductivity than that of said slider.

2. The apparatus of claim 1 wherein said holder comprises a material selected from the group consisting of sapphire and boron nitride.

3. The apparatus of claim 2 wherein said slider comprises graphite.

4. The apparatus of claim 1, 2 or 3 further including
    an upper slider disposed between the bottom of said holder and said lower slider,
    said upper slider having a plurality of apertures extending transversely therethrough for skimming off a portion of said solutions and bringing said portions into contact with said substrate sequentially,
    said upper slider comprising a material having a lower thermal conductivity than that of said lower slider.

5. The apparatus of claim 4 wherein said upper slider comprises a material selected from the group consisting of sapphire and boron nitride.

6. Apparatus for the liquid phase epitaxial growth of Ga-containing Group III-V compound semiconductor layers on a Group III-V compound semiconductor substrate, comprising
    a sapphire solution holder having a plurality of wells for carrying Ga-containing source solutions from which said layers are to be grown,
    an upper sapphire slider disposed under said holder and having a plurality of apertures extending transversely therethrough for skimming off a portion of said solutions and for bringing said portions into contact with said substrate sequentially, and
    a graphite lower slider disposed under said upper slider and having a recess therein for carrying said substrate,
    said holder and said sliders being adapted so that when said solution portion is in contact with said substrate, it is surrounded on its top and sides by the sapphire of said holder and said upper slider.

* * * * *